United States Patent
Martter et al.

(10) Patent No.: US 6,617,520 B1
(45) Date of Patent: Sep. 9, 2003

(54) CIRCUIT BOARD

(75) Inventors: Robert H. Martter, Erie, PA (US); Craig C. Sundberg, Erie, PA (US); Richard N. Giardina, Erie, PA (US); Brian S. Fetscher, Erie, PA (US); G. James Deutschlander, Erie, PA (US)

(73) Assignee: Heatron, Inc., Leavenworth, KS (US)

( * ) Notice: Subject to any disclaimer, the term of this patent is extended or adjusted under 35 U.S.C. 154(b) by 0 days.

(21) Appl. No.: 09/650,824

(22) Filed: Aug. 30, 2000

(51) Int. Cl.$^7$ ................................................ H05K 1/03
(52) U.S. Cl. ........................ 174/255; 174/262; 29/852
(58) Field of Search ........................ 174/260, 262–266; 361/743, 792–795; 29/837, 845, 852

(56) References Cited

U.S. PATENT DOCUMENTS

| | | | |
|---|---|---|---|
| 3,654,583 A | * 4/1972 | Mancini | 339/17 |
| 4,170,819 A | * 10/1979 | Peter et al. | 29/625 |
| 4,478,884 A | * 10/1984 | Barnes et al. | 29/852 |
| 4,585,295 A | 4/1986 | Ackerman | 339/258 R |
| 4,765,860 A | * 8/1988 | Ueno et al. | 156/272.6 |
| 4,866,571 A | * 9/1989 | Butt | 361/386 |
| 4,881,906 A | 11/1989 | Mackanic et al. | 439/83 |
| 4,982,376 A | * 1/1991 | Megens et al. | 361/400 |
| 4,997,698 A | * 3/1991 | Oboodi et al. | 428/209 |
| 5,025,553 A | 6/1991 | Telco | 29/852 |
| 5,106,308 A | * 4/1992 | Gollomp et al. | 439/67 |
| 5,281,770 A | * 1/1994 | Kamei et al. | 174/261 |
| 5,554,965 A | 9/1996 | Sundberg | 338/160 |
| 5,605,715 A | 2/1997 | Giardina et al. | 427/96 |
| 5,799,393 A | 9/1998 | Backasch et al. | 29/852 |
| 5,920,977 A | * 7/1999 | Wyckoff et al. | 156/196 |
| 6,141,496 A | 10/2000 | Sundberg et al. | 392/390 |

* cited by examiner

*Primary Examiner*—Kamand Cuneo
*Assistant Examiner*—Jeremy Norris
(74) *Attorney, Agent, or Firm*—Rankin, Hill, Porter & Clark LLP

(57) ABSTRACT

A circuit device and a method for providing an interface between a circuit device comprised of a porcelain enameled metal substrate and an external electrical conductor such as a wire or a lead. An aperture is formed in the substrate at the location where the connection is desired. An eyelet is then placed in the aperture. Crimping or other means are used to form a mechanical connection to the substrate and causes the eyelet to be retained in the aperture. The wire or lead of an electronic component is then inserted into the eyelet. The wire or lead is then soldered to the eyelet providing a joint of high mechanical strength.

25 Claims, 3 Drawing Sheets

CIRCUIT BOARD

FIELD OF THE INVENTION

This invention relates to electrical circuit devices comprising porcelain enameled coated metal substrates such as printed circuit boards wherein conductive patterns are applied to the surfaces of the porcelain enameled coated metal substrates. In particular, the invention relates to forming high strength solder connections between a flexible conductor, for example, a wire or the lead of an electronic component and the printed circuit boards formed of porcelain enamel coated metal substrates. The invention also relates to the devices formed in accordance with the methods of the invention.

BACKGROUND OF THE INVENTION

Many modern printed circuit cards comprise substrates formed of porcelain enameled metal. Circuits are formed on the substrates using conductive, dielectric or other resistive materials.

The resulting coated metal substrate can be used for circuit boards, thermal sinks, thermal barriers, RF shielding, magnetic flux conduction, mechanical attachments and other related applications. Such coated metal substrates that are coated with a porcelain enameled material are commonly referred to as porcelain enameled metal substrates (PEMS).

Discrete circuit patterns can be formed on the PEMS by conventional techniques such as screen printing, firing, etc. The circuit patterns can serve as switch contacts, circuit traces to carry current, and terminals for interconnection of external wires. The circuit patterns may be formed on one or both sides of the substrate.

In the prior art, in order to attach a wire or other conductor such as a lead to the circuit formed on the PEMS, an aperture would be created in the substrate, the wire or conductor would then be inserted into the aperture, and the wire or conductor would be soldered to the electrical circuit. Alternatively, the wire or lead was soldered to a pad formed by thick film material on the surface of the substrate. However, these conventional soldering techniques resulted in weak joints. The weakness of the solder joint at the connection is a very common problem. Typically the strength of the solder joint on these electrical circuit devices are less than half the pull strength of similar solder joints on electrical circuit devices comprised of, for example, alumina ceramic. Thus, a need exists for a method to secure conductors to a PEMS that provides high mechanical strength and durability as well as good electrical conductivity.

SUMMARY OF THE INVENTION

In view of the aforementioned needs, the invention contemplates a durable, high strength interface or connection between a printed circuit board comprised of porcelain enamel coated metal substrates and an external conductor such as a wire or a lead of an external electronic component.

In the method of the present invention, an aperture is first created in the substrate. The aperture is formed in a manner to ensure that the metal substrate is electrically insulated from the aperture. Then, an eyelet is inserted into the aperture. The eyelet is usually crimped, but other means are available that will cause the eyelet to be mechanically retained in the aperture and form an electrical connection between the eyelet and circuitry formed on the surface of the printed circuit board. A conductor is then inserted into the eyelet and then soldered to the eyelet such that the thick film adjoins the eyelet. The addition of an eyelet to the soldered joint connection mechanically reinforces the solder joint and provides unexpected vastly improved mechanical strength to the joint.

Among those benefits and improvements that have been disclosed, other objects and advantages of this invention will become apparent from the following description taken in conjunction with the accompanying drawings. The drawings constitute a part of this specification and include exemplary embodiments of the present invention and illustrate various objects and features thereof.

DETAILED DESCRIPTION OF THE INVENTION

Figure 1:
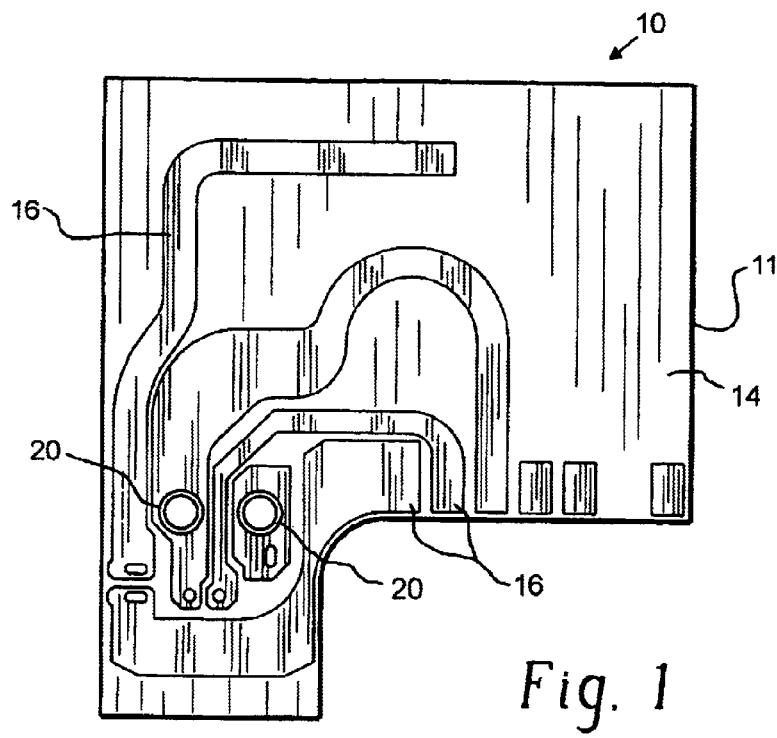
FIG. 1 shows a top view of a circuit board embodiment according to the present invention.
Figure 1A:
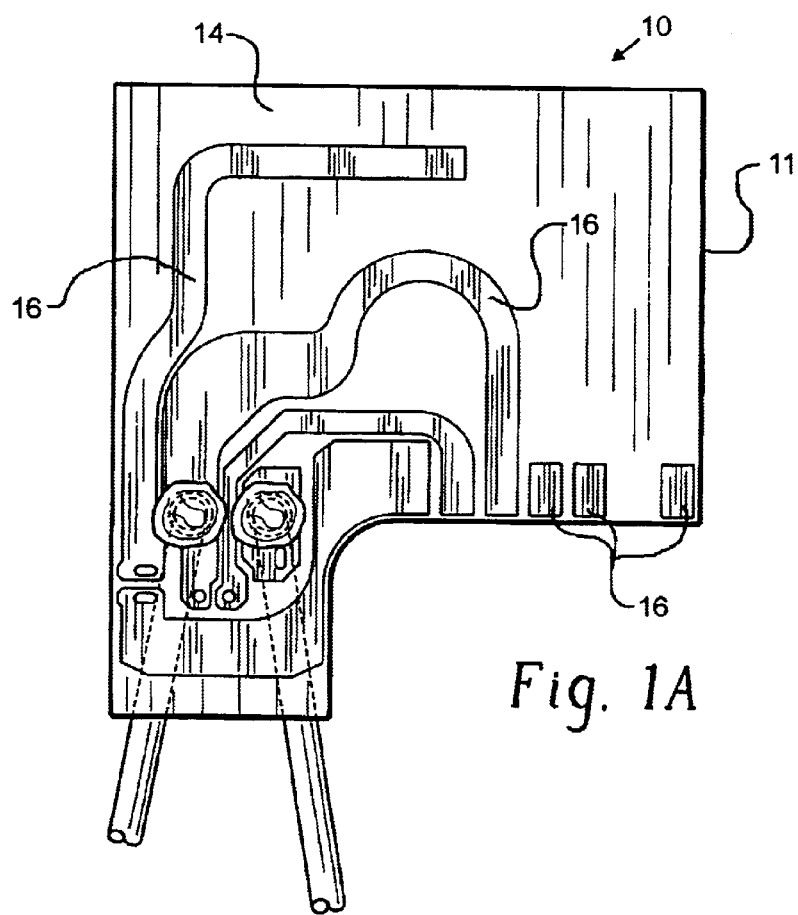
FIG. 1A shows a top view of the circuit board of FIG. 1 with the leads mounted to the board.
Figure 1B:
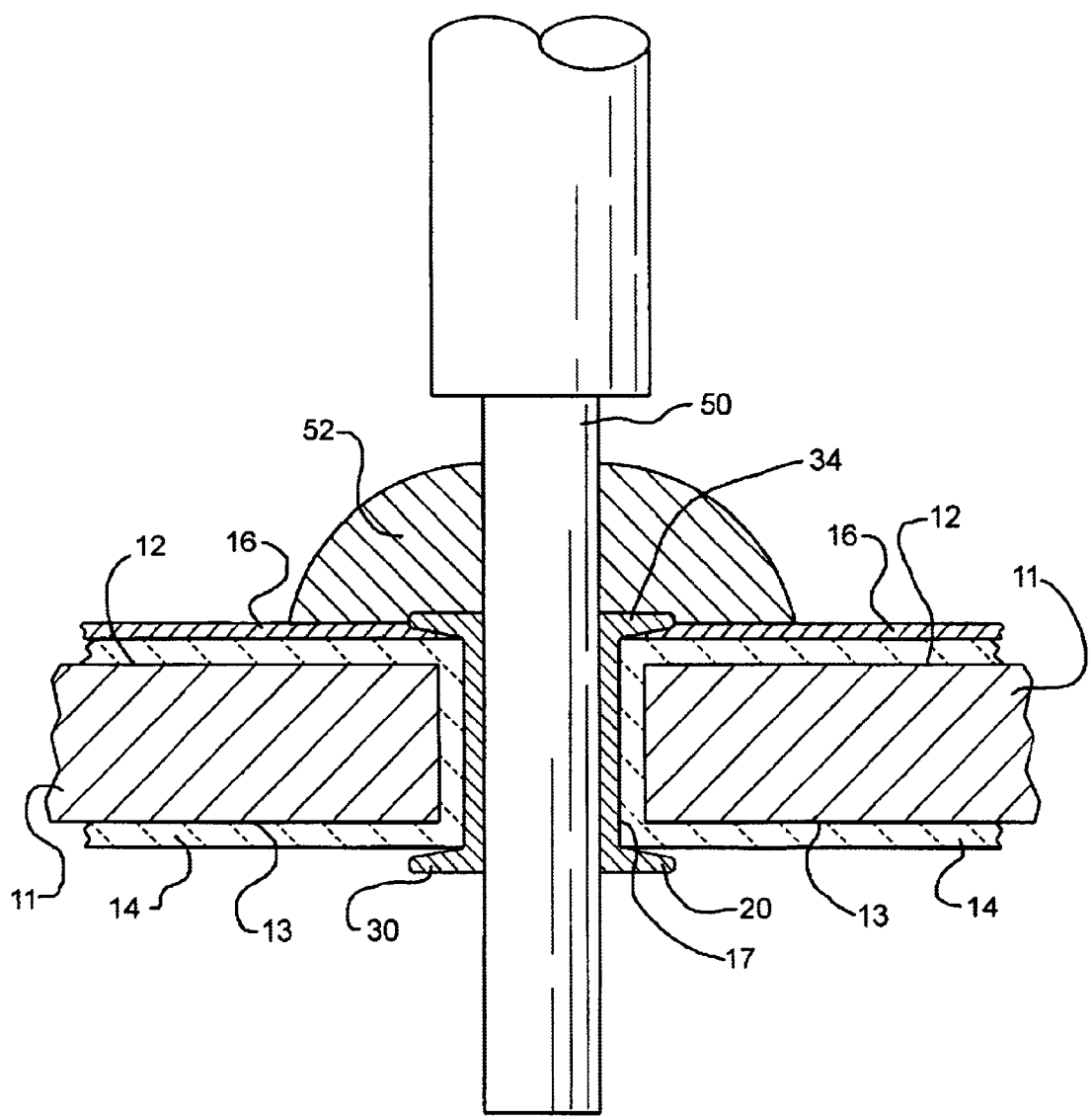
FIG. 1B is a schematic broken-away cross-sectional view of a portion of a circuit board made in accordance with the present invention.

Referring more particularly to the drawings and initially to FIGS. 1, 1A and 1B, there is shown a portion of an electrical circuit device 10 having a conductive and supportive metal substrate or base 11. In a preferred embodiment, base 11 comprises a steel substrate coated along the top 12 and bottom 13 surfaces with porcelain enamel 14. In each of the drawings 1–4, the same reference numerals have been utilized to identify similar elements. The porcelain enamel coated steel substrates are commercially available from the ECA Electronics Company located in Erie, Pa. In addition to a porcelain enameled steel substrate, it will be appreciated that base 11 may comprise any number of other conventional metal substrate materials such as, for example, low carbon steel, stainless steel or aluminum.

Device 10 include conductive circuit patterns 16 formed on at least one surface of the dielectric material or enamel 14. Methods for forming the circuit patterns on the substrate are well known to those skilled in the art, such as screen printing, firing, etc. See U.S. Pat. No. 5,605,715 issued to Giardina, et al. or U.S. Pat. No. 5,554,965 issued to Sundberg which applicant hereby incorporates by reference for additional examples of methods used for forming circuit patterns on porcelain enameled metal substrates. The methods for forming the conductive circuit patterns on dielectric materials such as porcelain enamel are well-known in the art, and are not limited to those methods specifically disclosed herein.

Referring once again to FIG. 1B an aperture 17 is created in the base 11 and the enamel 14 in order for an external conductor to be connected to the circuit device 10. A hollow mechanical fastener, normally a metal eyelet 20, is then inserted into the aperture. A typical eyelet suitable for use with this invention is sold by Keystone Electronics Corp, 31-07 20th Road, Astoria, N.Y. 11105. Eyelets are available in a variety of sizes so as to accommodate a variety of aperture opening sizes and lead sizes. Eyelets that are pre-scored, that is groves are placed in the eyelet for easy separation upon crimping, are also available. Pre-scored eyelets are available commercially from Mark Eyelet and Stamping, 63 Wakelee Road, Wolcot, Conn. Similarly, "solder through" eyelets, that is special eyelets which utilize capillary action to carry molten solder from the bottom side of a printed circuit board eyelet in a single operation are commercially available. These fasteners or eyelets are Conn. Similarly, "solder through" eyelets, that is special eyelets which utilize capillary action to carry molten solder from the bottom side of a printed circuit board eyelet in a single operation are commercially available. Fasteners are available in a variety of materials, for example, brass, aluminum, steel and copper.

Figure 2:
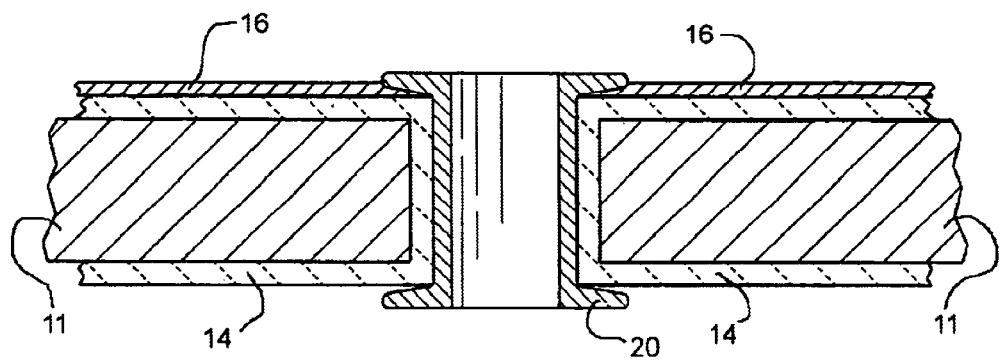
FIG. 2 shows a schematic broken-away cross-sectional view taken showing a portion of a circuit board made in accordance with the present invention wherein the metal substrate is electrically insulated from the hollow mechanical fastener.
Figure 3:
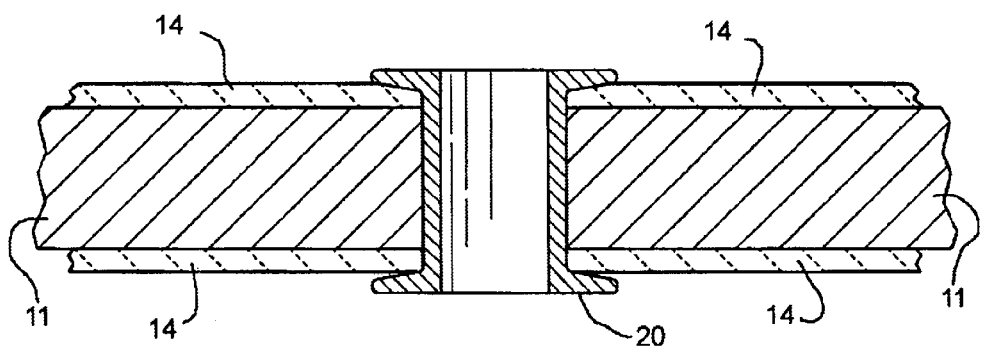
FIG. 3 shows a cross-sectional view of an embodiment according to the present invention wherein the metal substrate is in electrical contact with the hollow mechanical fastener.
Figure 4:
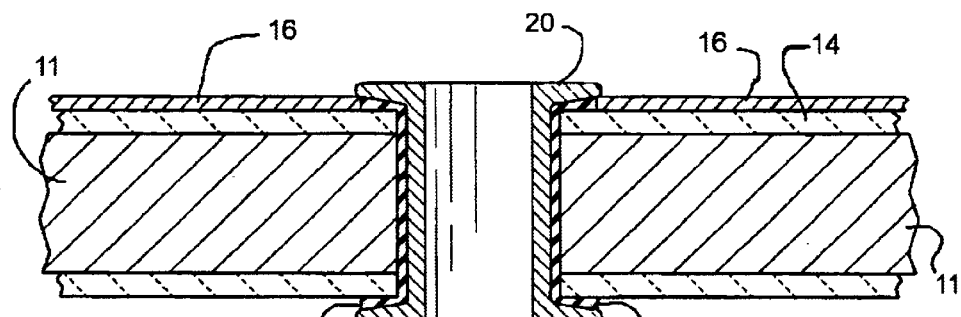
FIG. 4 shows a cross-sectional view of a embodiment of the invention wherein the metal substrate is electrically insulated from the hollow mechanical fastener.

Since the typical hollow mechanical fastener or eyelet is comprised of metal, means to electrically insulate the steel substrate 11 from the eyelet 20 are necessary to prevent the eyelet from short circuiting the circuit patterns 16 to the substrate 11. As illustrated in FIG. 2, one method of doing this is by coating or covering walls of the opening 17 of the steel substrate 11 with the dielectric enamel material 15. As shown in FIG. 3, in applications where it may be desirable not to electrically isolate the fastener 20 from the base 11, the base 11 can be allowed to contact or engage the fastener 20. A further alternative embodiment is illustrated in FIG. 4, wherein the steel substrate 11 is insulated from the aperture 20 by a nonconductive sleeve 25. Such sleeve 25 is formed of a flexible material such as silicone or an elastomer.

The hollow mechanical fastener 20 is preferably mechanically fastened to the electrical circuit device 10. The method of fastening is dependent on the type of fastener used. The typical eyelet is flanged on one end 30 and then inserted into the hole or aperture 17. The opposite end 34 of the eyelet is then crimped, causing the eyelet to deform by forcing the metal to expand, forming an annular ring which is larger then the hole 17 and the annular ring is compressed against the circuit pattern 16, making mechanical contact with the surface of the board, thereby mechanically holding the eyelet in place and preventing the eyelet from sliding back through the hole 17. However, several other methods of mounting are available such as soldering, threading the opposite end of the fastener and utilizing a nut, insertion of a sleeve inside the hollow metallic fastener with a flanged end that is secured with clips, retaining pins, or a compression fitting. As there are many different methods known to those skilled in the art, this list is meant to be illustrative, not exhaustive or exclusive.

Once eyelet 20 is mounted, a (metal wire such as a conventional flexible copper wire) metal conductor 50 is then inserted inside the eyelet 20. Solder 52 is then applied to the joint to form a permanent mechanical and electrical connection. In the preferred embodiment, additional solder 52 is applied so that the conductor 50, eyelet 20, and conductive circuit 16 are all permanently electrically and mechanically connected on the electrical circuit device 10 as shown in FIG. 2. If desired, the conductor 50 may also be soldered to the opposite surface of the eyelet 20, or similarly to the eyelet on the opposite surface of the circuit device 10 and any circuitry on that side. This invention does not contemplate that a specific surface on the electric circuit device must be used, any or all surfaces may be used.

Although the invention has been shown and described with respect to preferred embodiments, it is obvious that equivalent alterations and modifications will occur to others skilled in the art upon reading and understanding the specification. The present invention includes all such equivalent alterations and modifications, and is limited only by the scope of the following claims.

What is claimed is:

1. A method for connecting an external electrical conductor to a porcelain enameled metal substrate electrical circuit device comprising:
   (a) providing a porcelain enameled metal substrate having an aperture formed therein;
   (b) inserting a hollow mechanical fastener through the aperture;
   (c) mechanically fastening the fastener to the metal substrate so as to form an eyelet;
   (d) inserting the external electrical conductor into the eyelet;
   (e) applying solder to the external electrical conductor and the eyelet, wherein the external electrical conductor is a wire, and the eyelet is comprised of brass.

2. The method in claim 1 wherein the eyelet is electrically connected to a conductor on at least one surface of the electrical circuit device.

3. The method in claim 2 wherein the eyelet is soldered to at least one surface of the electrical circuit device.

4. The method in claim 1 wherein the external electrical conductor is a lead to an electronic component.

5. A circuit device comprised of a porcelain enameled metal substrate having a conductive-circuit formed thereon and an external electrical conductor attached thereto comprising a metal base coated with porcelain enamel and an aperture formed in said base, said aperture having mounted thereon a fastener, said electrical conductor being soldered to said fastener, wherein said porcelain enamel metal substrate includes two major surfaces, and said conductive circuit is formed on both of said major surfaces.

6. The circuit device as set forth in claim 5 wherein the external electrical conductor is a wire.

7. The circuit device as set forth in claim 5 wherein the external electrical conductor is a lead to an electronic component.

8. The circuit device as set forth in claim 5 wherein the external electrical conductor comprises a length of flexible copper wire.

9. The circuit device as set forth in claim 5 wherein the fastener is mechanically crimped to the metal substrate.

10. The circuit device as set forth in claim 5 wherein the fastener is electrically insulated from the metal substrate.

11. The circuit device as set forth in claim 5 wherein the fastener is electrically connected to the conductive circuit.

12. The circuit device as set forth in claim 5 wherein the fastener forms an eyelet, and the eyelet is comprised of brass.

13. The circuit device as set forth in claim 12 wherein the eyelet is electrically connected to a conductor on at least one surface of the electrical circuit device.

14. The circuit device as set forth in claim 12 wherein the eyelet is soldered to at least one surface of the electrical circuit device.

15. The circuit device as set forth in claim 5 wherein the metal substrate comprises low carbon steel.

16. A circuit device comprised of a porcelain enameled metal substrate having a conductive circuit formed on each side of said substrate comprising a metal base coated with porcelain enamel and an aperture formed in said base, said aperture having mounted therein a fastener, said fastener electrically connecting said conductive circuits formed on each side of said substrate.

17. The circuit device as set forth in claim 16 further comprising an external electrical conductor.

18. The circuit device as set forth in claim 17 wherein the external electrical conductor is a lead to an electronic component.

19. The circuit device as set forth in claim 17 wherein the external electrical conductor comprises a length of flexible copper wire.

20. The circuit device as set forth in claim 16 wherein the fastener is mechanically crimped to the metal substrate.

21. The circuit device as set forth in claim 16 wherein the fastener is electrically insulated from the metal substrate.

22. The circuit device as set forth in claim 16 wherein the fastener is electrically connected to at least one of the conductive circuits.

23. The circuit device as set forth in claim 16 wherein the fastener forms an eyelet, and the eyelet is comprised of brass.

24. The circuit device as set forth in claim 23 wherein the eyelet is soldered to at least one surface of the electrical circuit device.

25. The circuit device as set forth in claim 16 wherein the metal substrate comprises low carbon steel.

\* \* \* \* \*